United States Patent
Below et al.

(10) Patent No.: US 7,674,126 B2
(45) Date of Patent: Mar. 9, 2010

(54) CONTACTS FOR USE IN MONITORING CONNECTION PATTERNS IN DATA PORTS

(75) Inventors: Randy J. Below, Cheshire, CT (US); Frank Velleca, Woodbury, CT (US); Jinloong Yong, Watertown, CT (US)

(73) Assignee: The Siemen Company, Watertown, CT (US)

( * ) Notice: Subject to any disclaimer, the term of this patent is extended or adjusted under 35 U.S.C. 154(b) by 0 days.

(21) Appl. No.: 12/247,472

(22) Filed: Oct. 8, 2008

(65) Prior Publication Data

US 2009/0098763 A1 Apr. 16, 2009

Related U.S. Application Data

(60) Provisional application No. 60/978,180, filed on Oct. 8, 2007.

(51) Int. Cl.
*H01R 3/00* (2006.01)
(52) U.S. Cl. ...................................... 439/489
(58) Field of Classification Search ................ 439/489, 439/59, 62, 63, 188, 607; 324/538
See application file for complete search history.

(56) References Cited

U.S. PATENT DOCUMENTS

| | | | |
|---|---|---|---|
| 5,328,390 A | 7/1994 | Johnston et al. | |
| 6,315,620 B1 * | 11/2001 | Moir et al. | 439/862 |
| 7,128,594 B2 | 10/2006 | O'Connor et al. | |
| 7,207,846 B2 * | 4/2007 | Caveney et al. | 439/676 |
| 2002/0155760 A1 | 10/2002 | Brand et al. | |
| 2003/0095395 A1 | 5/2003 | Clark et al. | |
| 2005/0186819 A1 * | 8/2005 | Velleca et al. | 439/188 |
| 2007/0197094 A1 * | 8/2007 | Velleca | 439/607 |
| 2007/0243725 A1 * | 10/2007 | Nordin et al. | 439/49 |

OTHER PUBLICATIONS

International Search Report, PCT/US2008/079125, Dec. 12, 2008.

* cited by examiner

*Primary Examiner*—Chandrika Prasad
(74) *Attorney, Agent, or Firm*—Cantor Colburn LLP

(57) ABSTRACT

A telecommunications connection system including a plug; an outlet; the plug including: a plug body; transmission contacts supported in the plug body, the transmission contacts transmitting signals when the plug is mated with the outlet; a plug contact mounted on the plug body, the plug contact deflecting towards the plug body upon mating the plug with the outlet, the plug contact carrying a connectivity signal for monitoring port-to-port connectivity; a conductor in electrical connection with the plug contact; an outlet contact for making contact with the plug contact for transmission of the connectivity signal; outlet transmission contacts in the outlet making electrical contact with the transmission contacts.

8 Claims, 5 Drawing Sheets

CONTACTS FOR USE IN MONITORING CONNECTION PATTERNS IN DATA PORTS

CROSS-REFERENCE TO RELATED APPLICATIONS

This application claims the benefit of U.S. provisional patent application Ser. No. 60/978,180 filed Oct. 8, 2007, the entire contents of which are incorporated herein by reference.

BACKGROUND

Patch panels are often used to provide an interconnection between telecommunication outlets and active equipment. One difficulty experienced with patch panels is knowing which port of the patch panel is connected to which port on other patch panels or active equipment. One solution to this problem is disclosed in U.S. Pat. No. 6,574,586, the entire contents of which are incorporated herein by reference. As shown in FIG. 1, U.S. Pat. No. 6,574,586 discloses a system in which an adapter jacket 1 having an external plug contact 2 is placed on the plug 3. The plug contact 2 is biased by a spring 4. An additional conductor 5, often referred to in the art as the ninth wire, electrically connects plug contacts on opposite ends of a patch cord. Plug 3 mates with an outlet 6 in a patch panel. Above outlet 6 is an adapter printed circuit board (PCB) 7 having an outlet contact 8. The outlet contacts 8 are wired to an analyzer that then can determine which outlets are connected by patch cords by applying a connectivity signal to each outlet contact.

U.S. Pat. No. 7,193,422, the entire contents of which are incorporated herein by reference, describes a patch panel system in which a screen is provided on a plug to make electrical contact with a conductive tab at an outlet. This electrical connection allows port-to-port connectivity to be monitored. Alternate plug contacts for ninth wire systems are shown in pending U.S. patent application publication 20070197094, the entire contents of which are incorporated herein by reference.

In the system of U.S. Pat. No. 6,574,586, the spring-loaded pin provided on the plug boot has drawbacks. One problem with the spring-loaded pin is that it is difficult to captivate in relation to the RJ45 or fiber connector. Current methods used to captivate the spring-loaded pin include an overmolded boot, a clip on boot or a boot designed specifically to work with the spring-loaded. These methods are more difficult to assemble than standard patch cords.

Another problem is that the spring-loaded pin 2 is deflected in a direction normal to the patch panel front face. This has several drawbacks. First, if there is a problem with the PCB 7 on which the outlet contact 8 is positioned, it is impossible to replace the PCB 7 without disturbing the data connections established by the plug 3 and outlet 6. In other words, the plug 3 must be disconnected to service the outlet contact PCB 7. Second, RJ45 and fiber mated connections have a certain amount of "play" in the connection. The "play" travel is greater in the horizontal direction (i.e., normal to the face of the patch panel) versus the vertical direction. To compensate for the horizontal play a longer contact pin 2 is required on the plug, making the pin 2 more prone to damage during use. Lastly, incidental contact with the pogo pin 2 (during normal use) is usually applied in a vertical direction, or parallel to the face of the patch panel. This can damage the pin 2, making it unable to perform its normal function.

SUMMARY

Exemplary embodiments include a telecommunications connection system including a plug; an outlet; the plug including: a plug body; transmission contacts supported in the plug body, the transmission contacts transmitting signals when the plug is mated with the outlet; a plug contact mounted on the plug body, the plug contact deflecting towards the plug body upon mating the plug with the outlet, the plug contact carrying a connectivity signal for monitoring port-to-port connectivity; a conductor in electrical connection with the plug contact; an outlet contact for making contact with the plug contact for transmission of the connectivity signal; outlet transmission contacts in the outlet making electrical contact with the transmission contacts.

Other exemplary embodiments will be or become apparent to one with skill in the art upon review of the following drawings and detailed description.

DETAILED DESCRIPTION

Figure 2:
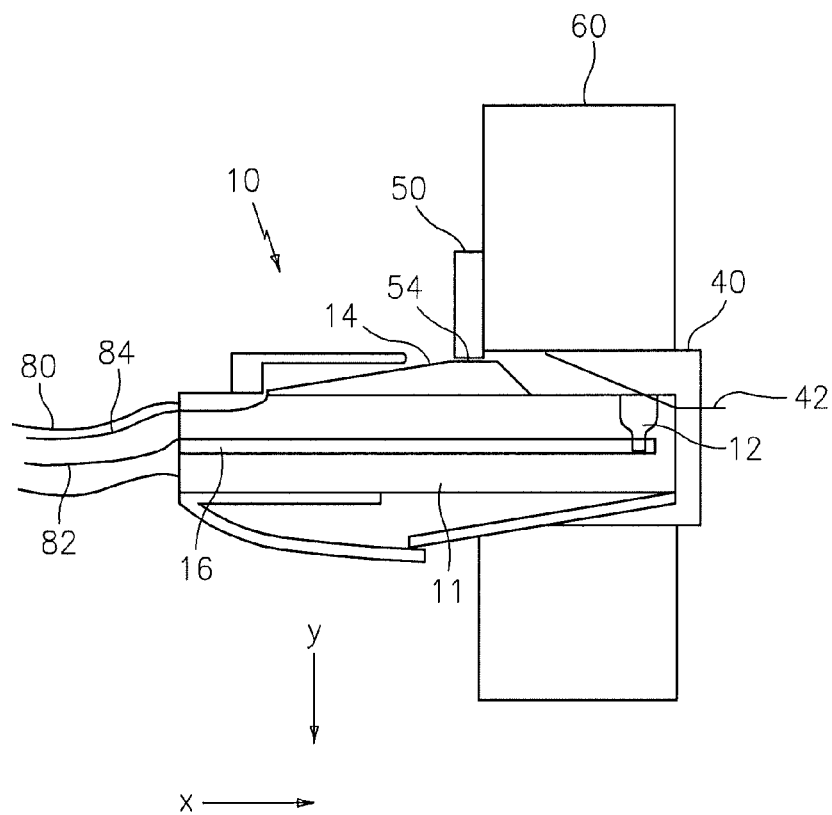
FIG. 2 illustrates a plug mated with an outlet in an embodiment of the invention.

FIG. 2 illustrates a plug 10 mated with an outlet 40 mounted in a patch panel 60. Plug 10 includes a plug body 11 that supports certain plug components. Plug 10 includes transmission contacts 12 that mate with outlet transmission contacts 42 for carrying voice and/or data signals as known in the art. Plug 10 also includes a plug contact 14 that mates with an outlet contact 54 formed on a substrate 50 (e.g., a printed circuit board or PCB). PCB 50 is mounted on the outside face of patch panel 60. The plug contact 14 and the outlet contact 54 provide an electrical connection for transmitting a connectivity signal for monitoring port-to-port connectivity. Cable 80 includes transmission conductors 82 that carry voice and/or data signals along the patch cord. Transmission conductors 82 are electrically connected to plug transmission contacts 12 via a printed circuit board 16. It is understood that a PCB 16 may be replaced with lead frame elements, or eliminated completely with transmission conductors 82 mating directly with plug transmission contacts 12. Cable 80 also includes a conductor 84 that carries a signal for connectivity analysis. Conductor 84 is often referred to as the ninth wire in the art.

When plug 10 is mated with outlet 40, the plug contact 14 physically contacts outlet contact 54 to establish electrical connection. As described in further detail herein, the plug contact deflects downwards towards the plug body in a direction parallel to the front face of the patch panel 60. In other words, the plug 10 enters the outlet 40 along a plug-mating axis, X, shown in FIG. 2. The plug contact 14 deflects towards the plug body 11, along a deflection axis Y that is not parallel to the plug-mating axis X. Deflection axis Y may be substantially perpendicular to plug-mating axis X. This is an improvement over prior art systems of FIG. 1 where the pin deflects in a direction normal to the face of the patch panel 60.

Figure 3:
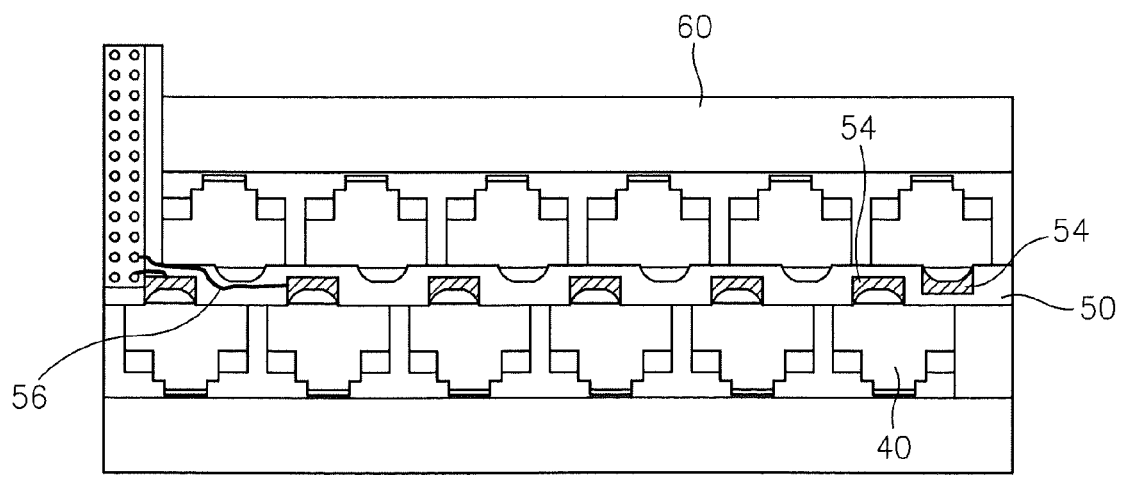
FIG. 3 illustrates a printed circuit board carrying outlet contacts in an embodiment of the invention.

FIG. 3 is front view of the patch panel 60 showing the PCB 50 mounted above outlets 40. As shown in FIG. 3, the outlet contacts 54 are formed on a bottom edge of the PCB 50 as a scalloped area. The outlet contacts 54 are formed by providing a conductive plated area on the scalloped portions of the PCB 50. Plug contact 14 touches the scalloped area to make electrical contact between plug contact 14 and outlet contact 54. PCB 50 includes traces 56 for transmitting a signal to and from the outlet contacts 54. This signal may be provided to an analyzer for determining connectivity of patch cords as known in the art.

The PCB 50 in FIG. 3 is depicted above the outlets 40, but other orientations may be used. The PCB 50 may be positioned below outlets 40 with the plug contact 14 positioned to engage the scalloped portions of the PCB. Further, the outlet contacts 54 may be positioned on either side of the outlet on PCB extensions that are positioned on either side of the outlets 40. In this embodiment, the plug contact 14 would also be positioned on the corresponding side of plug 10.

Figure 4:
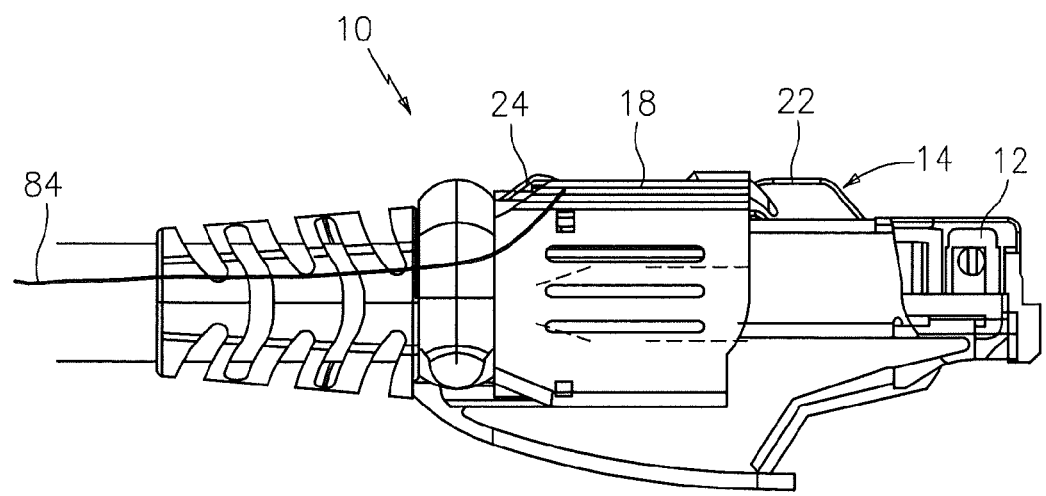
FIG. 4 is a side view of the plug of FIG. 2.

FIG. 4 is a side view of the plug 10 of FIG. 2. Plug 10 includes a boot 18, which covers a majority of the plug contact 14, leaving a plug contact beam 22 exposed so that the beam 22 can engage outlet contact 54. A plug contact test pad 24 is also exposed at the rear end of the plug housing 18. The test pad 24 allows a technician to monitor signals on the plug contact 14 and apply diagnostic signals to the plug contact 14. Conductor 84 is in electrical connection with plug contact 14 as described in further detail herein.

Figure 5:
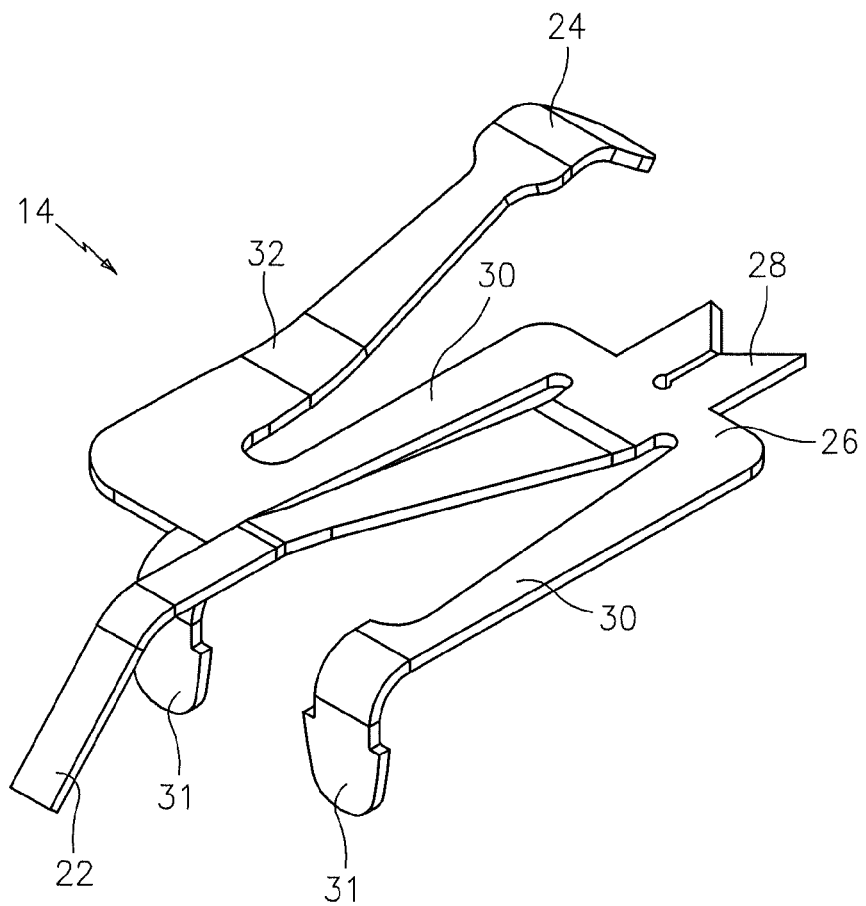
FIG. 5 illustrates the plug contact in an embodiment of the invention.

FIG. 5 is a perspective view of the plug contact 14. Plug contact 14 includes a base 26 having a contact point including an insulation displacement contact (IDC) 28 extending therefrom. The IDC 28 makes electrical connection with conductor 84. It is understood that other connections may be used such as an insulation piercing contact, crimp style contact or a solder terminal. Arms 30 extend from base 26 and bend downwards to barbed ends 31. Barbed ends 31 engage openings in the plug body to secure the contact 14 to the plug 10. Housing 18 is also placed over plug contact 14 to further secure plug contact 14 to the plug body.

Plug contact beam 22 extends from base 26 and bends downward at a distal end to form a cantilever beam 22. As described above, the cantilevered beam 22 deflects downwards towards the plug body so that when the plug 10 is mated with outlet 40, deflection is in a direction parallel to the front face of patch panel 60. Finger 32 extends upwards from one arm 30 and terminates at test pad 24.

Figure 5A:
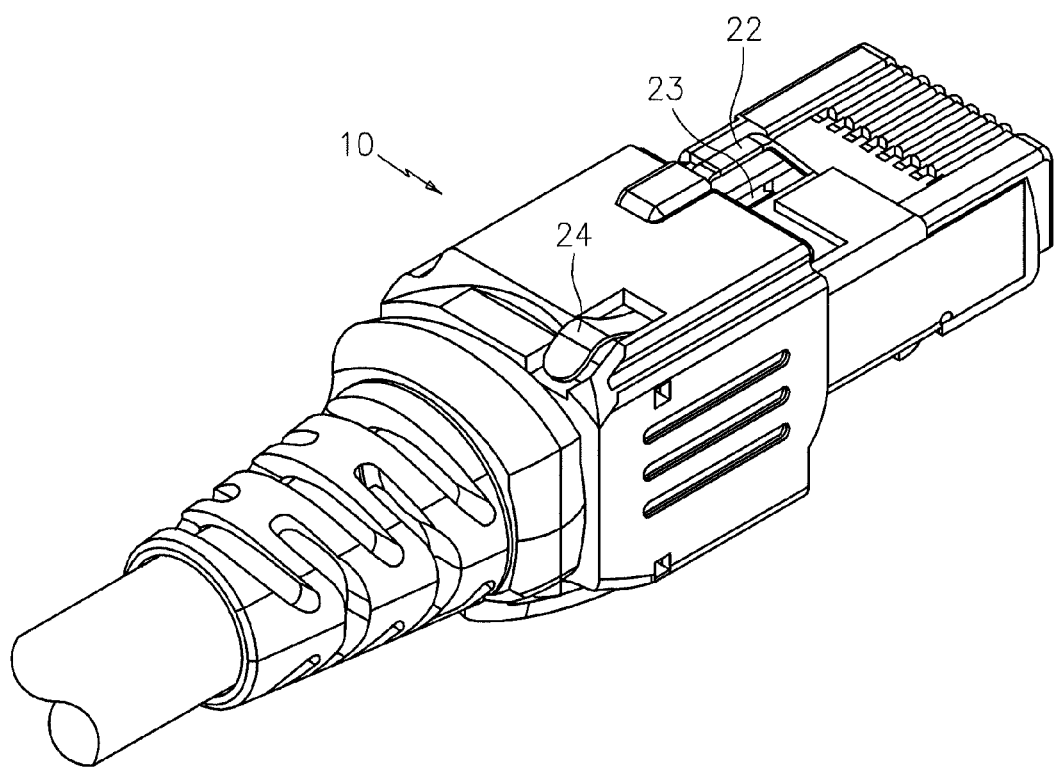
FIG. 5A illustrates the plug in an embodiment of the invention.

When plug 10 is mated with outlet 40, beam 22 deflects downwards towards the plug body and into an opening in the plug body. FIG. 5A is a perspective view of plug 10. As shown in FIG. 5A, the plug body includes an opening 23 into which the beam 22 deflects when plug 10 is mated with outlet 40. This allows the plug 10 to be compatible with existing outlets and meet IEC dimensional requirements for plugs, even with the inclusion of the plug contact 14.

Figure 6:
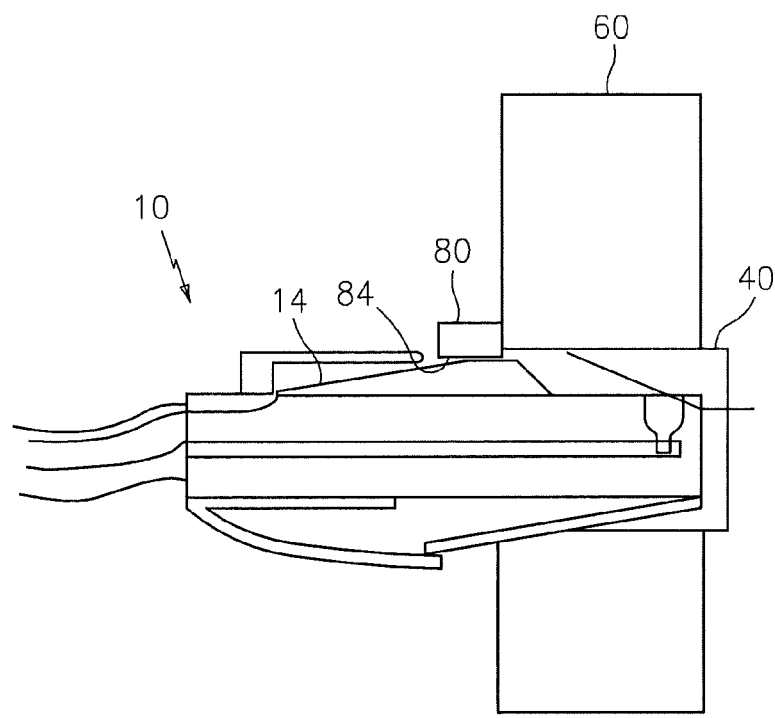
FIG. 6 illustrates a printed circuit board with outlet contacts an alternate embodiment of the invention.

FIG. 6 shows a plug 10 mounted in outlet 40 in an alternate embodiment. In this embodiment, a PCB 80 is mounted on the patch panel 60 such that the PCB 80 is in a horizontal configuration, rather than vertical as shown in FIG. 2. An outlet contact 84 is formed on the PCB 80 by plating an area of the PCB 80. Other components are similar to those in FIG. 2.

Figure 7:
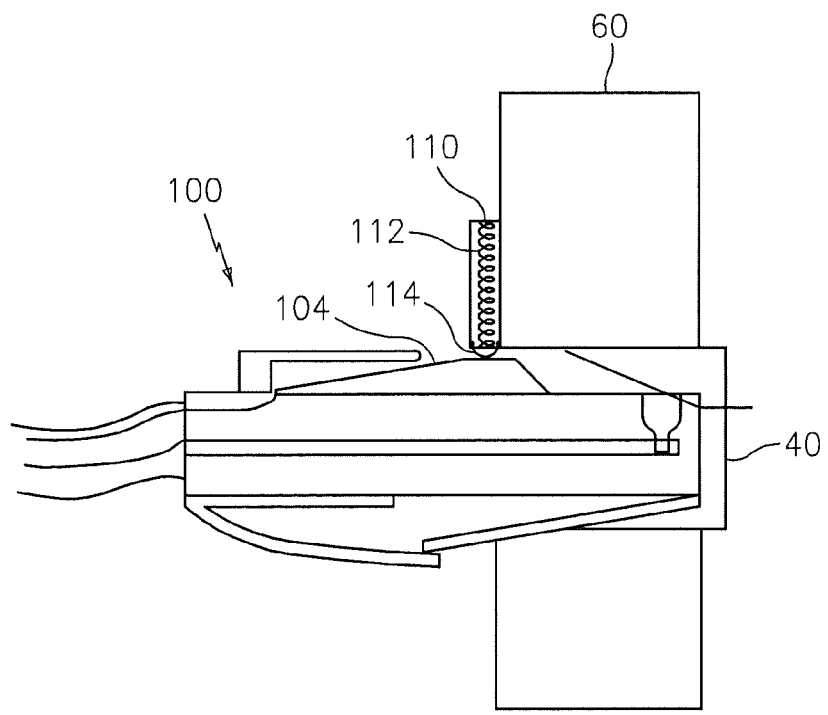
FIG. 7 illustrates a printed circuit board with outlet contacts an alternate embodiment of the invention.

FIG. 7 illustrates an alternate embodiment of plug 100 in which the plug contact 104 is rigid and the outlet contact 114 deflects when the plug 100 is mated with outlet 40. Plug contact 114 is a metal contact biased by a resilient member 112 (e.g., spring) contained in a housing 110. In this embodiment, the deflection of the outlet contact 114 is in a direction parallel to the face of patch panel 60. Again, this limits damage to the outlet contact as the outlet contact doe not extend away from the patch panel in a direction normal to the face of the patch panel.

The vertical travel, rather than horizontal travel, of the plug contact 14 allows for removal of PCB 50 or 80, or another conductive surface that resides on the patch panel without disturbing or removing the voice/data connections established by the plug and outlet. Incidental contact with the plug contact 14 is typically in a vertical direction. Since the plug contact 14 is designed to depress into the plug body when vertical force is applied, it is more robust and less likely to deform during normal use. The outlet contact surface on or in the patch panel mates with the plug contact on the plug in a vertical direction. If the PCB 50 or 80, or components mounted to the PCB are damaged, the entire PCB could be removed and replaced without disturbing the data connections in the panel.

Figure 1:
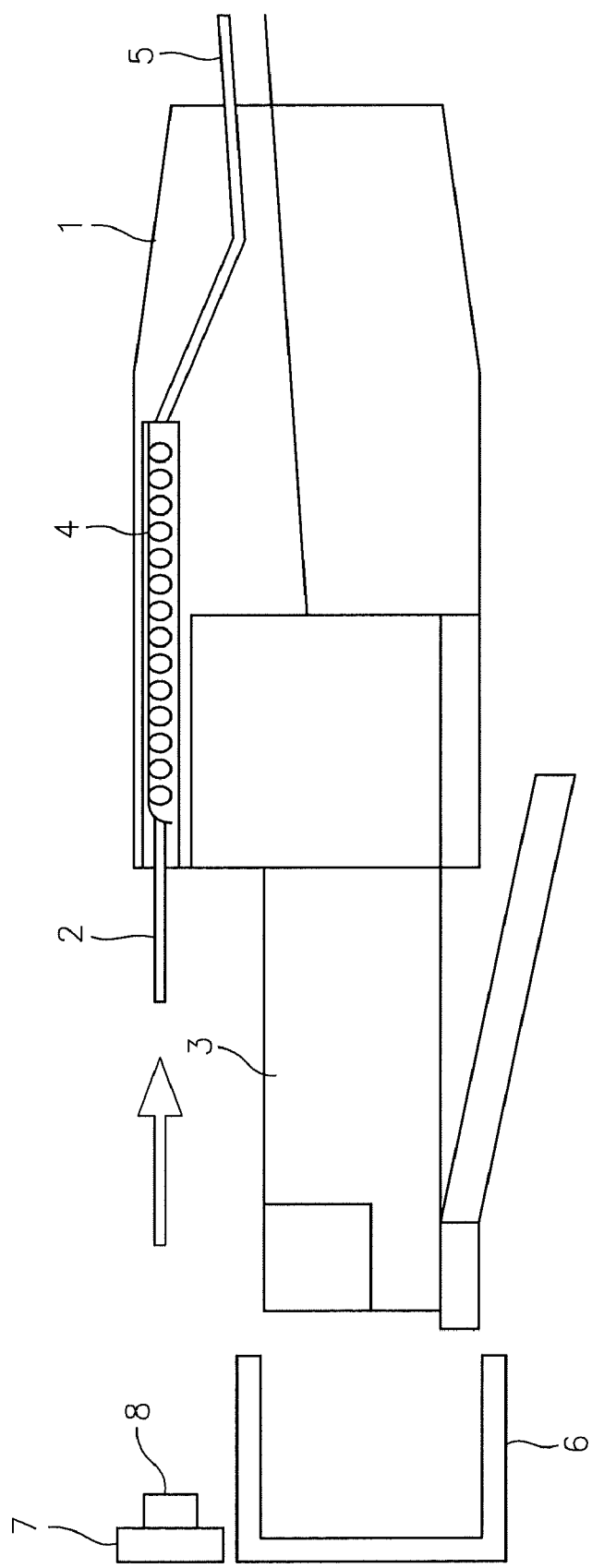
FIG. 1 illustrates a conventional plug with an outlet.

Embodiments of the invention provide several benefits. Deflection of plug contact 14 parallel to the face of the patch panel increases reliability of the mated connection and reduces or eliminates damage to the plug contact in patch plugs during normal use. Embodiments also allow for replacement or repair of the PCB assembly on a patch panel without disturbing voice/data connections between the plug and outlet. There is also a reduced cost to manufacture the plug, as the design is simpler than existing pogo pin designs in the prior art as shown in FIG. 1.

Embodiments of the invention have been described with reference to an RJ45 plug and outlet. It is understood that other electrical plug formats may be used and the invention is not limited to RJ45 plugs and outlets. Further, the plug contact 14 and outlet contact 54 may be used in conjunction with other types of connectors such as fiber, coaxial, etc. Thus, the terms plug and outlet and intended to cover a variety of transmission media (copper, fiber, coax) and a variety of connector formats.

While the invention has been described with reference to exemplary embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed for carrying out this invention.

What is claimed is:

1. A telecommunications connection system comprising:
   a plug;
   an outlet;
   the plug including:
      a plug body;
      transmission contacts supported in the plug body, the transmission contacts transmitting signals when the plug is mated with the outlet;
      a plug contact mounted on the plug body, the plug contact deflecting towards the plug body upon mating of the plug with the outlet along a plug mating axis, the plug contact carrying a connectivity signal for monitoring port-to-port connectivity, the plug contact deflecting towards the plug body along a deflection axis substantially perpendicular to plug-mating axis;
a conductor in electrical connection with the plug contact;
an outlet contact for making contact with the plug contact for transmission of the connectivity signal;
outlet transmission contacts in the outlet making electrical contact with the transmission contacts.

2. The telecommunications connection system of claim 1 wherein:
the plug contact includes a base and a plug contact beam extending from the base, the plug contact beam making contact with the outlet contact.

3. The telecommunications connection system of claim 2 wherein:
the plug contact includes a plug contact test pad;
the plug including a plug housing surrounding a portion of the plug body and the plug contact;
the plug housing having an opening providing access to the plug contact test pad.

4. The telecommunications connection system of claim 1 wherein:
the outlet contact is mounted on a substrate adjacent the outlet, the substrate is in a horizontal orientation.

5. The telecommunications connection system of claim 1 wherein:
the outlet contact is mounted on a substrate adjacent the outlet, the outlet contact is a plated area on the printed circuit board.

6. The telecommunications connection system of claim 5 wherein:
the plated area is a scalloped edge of the substrate.

7. The telecommunications connection system of claim 1 further comprising:
a patch panel, the outlet mounted in the patch panel;
wherein the outlet contact is mounted on a substrate on the patch panel, the substrate being removable from the patch panel without disconnecting the plug and outlet.

8. A telecommunications plug comprising:
a plug body;
transmission contacts supported in the plug body, the transmission contacts transmitting signals when the plug is mated with an outlet;
a plug contact mounted on the plug body, the plug contact deflecting towards the plug body upon mating the plug with the outlet along a plug mating axis, the plug contact carrying a connectivity signal for monitoring port-to-port connectivity, the plug contact deflecting towards the plug body along a deflection axis substantially perpendicular to plug mating axis;
a conductor in electrical connection with the plug contact.

* * * * *